United States Patent
Poux et al.

(10) Patent No.: US 7,571,399 B2
(45) Date of Patent: Aug. 4, 2009

(54) PROCESS FOR CHECKING THE QUALITY OF THE METALLIZATION OF A PRINTED CIRCUIT

(75) Inventors: Gilbert Poux, Garidech (FR); Jean-Luc Rebesco, Lasserre (FR)

(73) Assignee: Continental Automotive France, Toulouse (FR)

( * ) Notice: Subject to any disclaimer, the term of this patent is extended or adjusted under 35 U.S.C. 154(b) by 285 days.

(21) Appl. No.: 11/545,526

(22) Filed: Oct. 11, 2006

(65) Prior Publication Data
US 2007/0090852 A1 Apr. 26, 2007

(30) Foreign Application Priority Data
Oct. 21, 2005 (FR) .................................. 05 10771

(51) Int. Cl.
*G06F 17/50* (2006.01)
(52) U.S. Cl. .............................. 716/4; 716/5; 324/754; 324/765
(58) Field of Classification Search ................. 716/4–6, 716/15; 324/754, 765
See application file for complete search history.

(56) References Cited

U.S. PATENT DOCUMENTS

| | | | |
|---|---|---|---|
| 6,094,337 A * | 7/2000 | Ueda et al. .................. | 361/311 |
| 6,493,861 B1 | 12/2002 | Li et al. | |
| 2005/0173250 A1 | 8/2005 | Thies et al. | |

\* cited by examiner

*Primary Examiner*—Vuthe Siek
(74) *Attorney, Agent, or Firm*—Young & Thompson

(57) ABSTRACT

The invention relates to a process for checking the quality of the metallization of a printed circuit, and also includes the printed circuits produced. According to the invention, the checking process consists in providing a checking circuit (1) comprising n through openings (7-1 . . . 7-6, 8-1 . . . 11-6), called vias, on the one hand provided with an internal peripheral wall clad with a metallized layer (12), and on the other hand electrically connected in series between two electrical terminals (16-18, 20-22), in applying a current of predetermined intensity between the two electrical terminals of the checking circuit (1), in measuring the corresponding voltage difference, and in comparing the measured value with a threshold value representative of the voltage difference obtained for a metallized layer of minimum predetermined thickness deposited on the peripheral wall of each via, so as to validate the printed circuit when the measured value is less than the threshold value.

20 Claims, 2 Drawing Sheets

PROCESS FOR CHECKING THE QUALITY OF THE METALLIZATION OF A PRINTED CIRCUIT

BACKGROUND OF THE INVENTION

FIELD OF THE INVENTION

Figure 1:
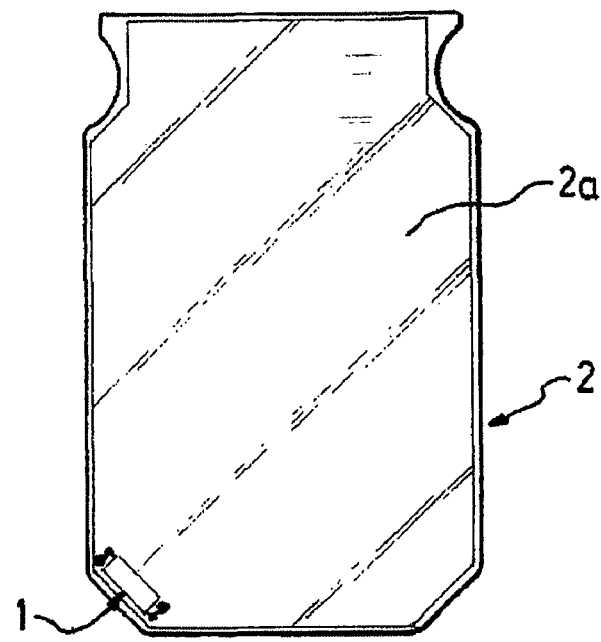

The invention relates to a process for checking the quality of the metallization of a printed circuit. It also relates to printed circuits produced according to this process.

DESCRIPTION OF THE RELATED ART

At present, the usual tests for checking the quality of the metallization of printed circuits consists of tests of electrical continuity permitting detecting possible faults of discontinuity of the formed tracks.

Such checking tests thus permit detecting effectively the "surface" defects of the metallized layers. On the other hand, they do not give any information as to the thickness of the deposited metallized layer, and this despite the importance of this fabrication parameter.

Thus, at present, only destructive checks consisting in carrying out metallographic cross-sections by removal, are performed. However, given their destructive character, such tests are carried out by sampling, with the random character that such a method provides.

SUMMARY OF THE INVENTION

The present invention seeks to overcome this drawback and has for its principal object to provide a process for checking the thickness of the metallization of a printed circuit, permitting performing a systematic and rapid checking of the produced printed circuits.

To this end, the invention envisages a process for checking the quality of the metallization of a printed circuit, consisting:

in making a checking circuit comprising n through openings, called vias, with n whole number greater than or equal to one, on the one hand provided with an internal peripheral wall adapted to be clad with a metallized layer during the step of metallization of the printed circuit, and on the other hand electrically connected in series between two electrical terminals, such that an electrical current applied between said electrical terminals passes through in the direction of its height each of the vias, in applying a current of predetermined intensity between the two electrical terminals of the checking circuit, in measuring the corresponding voltage difference, and in comparing the measured value with a threshold value representative of the voltage difference obtained for a metallized layer of minimum predetermined thickness deposited on the peripheral wall of each opening, so as to validate a printed circuit when the measured value is less than the threshold value.

The invention thus consists:

in designing a checking circuit comprising n metallized vias, constituting a "reduced image" of the printed circuit, permitting providing information representative of the thickness of the metallized layer formed on this printed circuit, and in causing a calibrated current to circulate in this checking circuit, and in deducing from the comparison between the measured value of the corresponding voltage difference with a predetermined standard value, the conformity or not of the printed circuit in terms of thickness of the metallized layer.

Each checking test thus consists in carrying out a measurement of the type commonly called "four point measurement", which can be carried out systematically and which requires only a short time, less than one second.

Moreover, according to the invention, the checking circuit can be constituted by functional vias of the printed circuits. However, for purposes of standardization of the checking circuits and the checking procedure, these checking circuits preferably consist in non-functional circuits specifically designated to the checking of the quality of the metallization of the printed circuits.

Moreover, so as to increase the sensitivity of the checking process, the checking circuit comprises preferably n vias, wherein n is a whole number greater than or equal to two, connected two by two in series by electrical bridges.

Moreover, there is preferably provided a checking circuit of which the n vias each have a diameter equivalent to the least diameter of the functional vias of the printed circuit. Because of this, the vias of the checking circuits consist in reproductions of the printed circuit elements which are the most susceptible, in theory, to be the origin of defects of metallization.

Furthermore, according to two desirable modified embodiments, the checking circuit can be provided:

either on a portion of the functional surface of the printed circuit, or on a technical strip for mechanical connection of the printed circuits, during their production.

The invention also comprises a printed circuit comprising a checking circuit comprising n through openings, called vias, with n a whole number greater than or equal to one, on the one hand provided with an internal peripheral wall clad with a metallized layer, and on the other hand electrically connected in series between two electrical terminals, such that an electrical current applied between said electrical terminals passes in the direction of its height along each of the vias.

Moreover, this printed circuit desirably comprises any one of the characteristics taken alone or in combination defined in the claims and/or set forth in the following description.

BRIEF DESCRIPTION OF THE DRAWING FIGURES.

Figure 2:
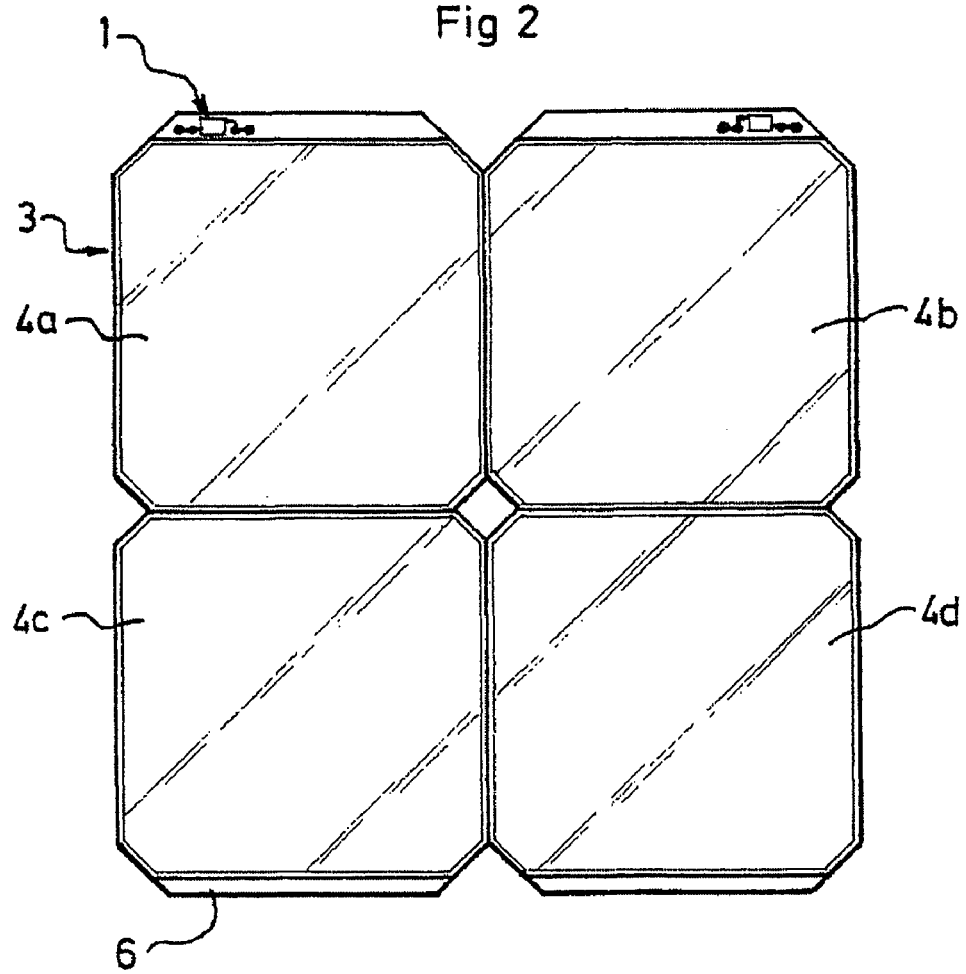
Figure 3:
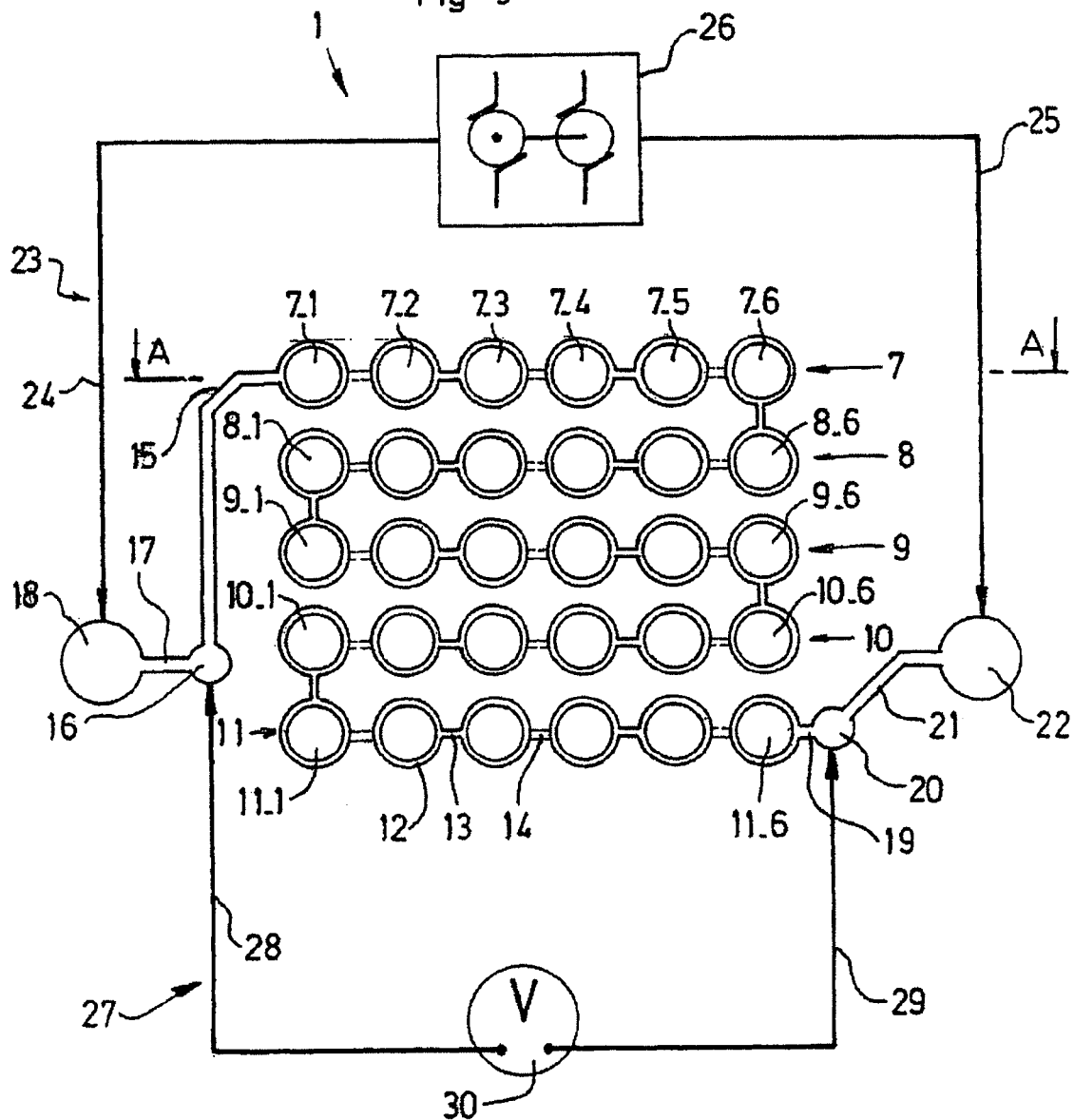
Figure 4:
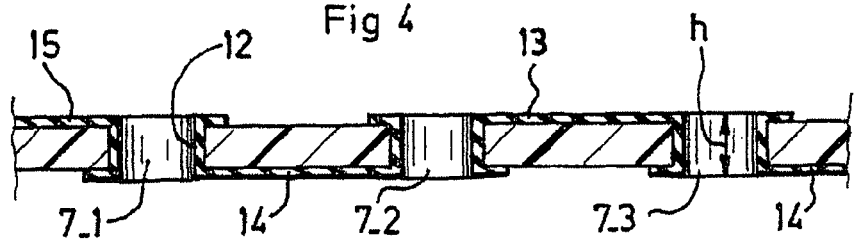

Other characteristics, objects and advantages of the invention will become apparent from the detailed description which follows, with reference to the accompanying drawings, which represent by way of non-limiting example two preferred embodiments. In the drawings:

FIG. 1 is a schematic plan view of a first design of printed circuit comprising a checking circuit according to the invention, FIG. 2 is a schematic plan view of printed circuits connected by technical strips comprising checking circuits according to the invention, FIG. 3 is a schematic view on an enlarged scale of a checking circuit according to the invention, and measuring means permitting testing the quality of the metallization of the printed circuits, and FIG. 4 is a schematic cross-sectional view, on the line A-A of FIG. 3, showing a portion of the checking circuit according to the invention.

DETAILED DESCRIPTION OF THE PREFERRED EMBODIMENTS

The process according to the invention has for its object to permit checking the quality of the metallization of a printed circuit (particularly to verify that this metallization layer has a minimum thickness within the through openings (vias) provided in a printed circuit), and consists, in the first instance, in providing a checking circuit 1 on said printed circuits.

According to the invention, this checking circuit 1 can be provided:

either, as shown in FIG. 1, on a portion of the functional surface 2a of each produced printed circuit 2, or, as shown in FIG. 2, on the technical strips such as 6 ensuring the mechanical connection of the printed circuits such as 4a, 4b, 4c, 4d, during production of these latter.

According to the principle of the invention, each checking circuit comprises a plurality of through openings 7-1 to 7-6, . . . 11-6, or vias, each provided with an internal peripheral wall (having a height h—FIG. 4—) clad with a metallized layer 12, said vias being electrically connected in series between two electrical terminals, such that each of said vias will be traversed electrically, in the direction of the height h, by a calibrated electrical current applied between said electrical terminals.

As shown in FIGS. 3 and 4, the different vias are distributed in five parallel rows 7, 8, 9, 10, 11 each comprising six vias such as 7-1, 7-2, 7-3, 7-4, 7-5, 7-6, 8-1 to 8-6, 9-1 to 9-6, 10-1 to 10-6, and 11-1 to 11-6. Moreover, these vias are electrically connected two by two by bridges such as 13, 14 (FIG. 4) extending alternately on the upper surface 13 and then on the lower surface 14 of the printed circuit, adapted, as mentioned above, such that a calibrated electrical current applied between the electrical terminals of the checking circuit 1 will pass in the direction of its height h through each of the vias.

Moreover, according to the invention, the two electrical terminals of the checking circuit 1 are provided on the upper surface of the printed circuit, and consist:

in a first electrical terminal constituted by two conductive lugs 16, 18 interconnected by a conductive track 17, and of which one of said lugs 16 is connected by a conductive track 15 to the first via 7-1 of the series of vias, and of a second electrical terminal constituted by two conductive lugs 20, 22 interconnected by a conductive track 21, and of which one of said lugs 20 is connected by a conductive track 19 to the latter via 11-6 of the series of vias.

As shown in FIG. 3, the checking tests for the checking circuits 1 described above are carried out, according to the invention, by means of a "four point system", comprising:

an electrical supply module 23 comprising two electrodes 24, 25 connected to a current generator 26, and a measuring module 27 comprising two electrodes 28, 29 connected to a voltmeter 30.

These checking tests moreover consist:

in causing a calibrated circuit to flow in the checking circuit 1, by positioning the electrodes 24, 25 of the electrical supply module 23 in contact with the lugs 18, 22 of said checking circuit, in measuring the voltage difference at the terminals of the checking circuit 1, by positioning the electrodes 28, 29 of the measuring module 30 in contact with the lugs 16, 20 of said checking circuit, and in comparing the measured value with a threshold value representative of the voltage difference obtained for a metallized layer 12 of minimum predetermined thickness deposited on the peripheral wall of each via, so as to validate the printed circuit when the measured value is less than the threshold value.

Such a checking procedure thus comprises a preliminary step of calibrating, consisting in taking the measured voltage difference for given thicknesses of layers 12 deposited within vias of a prototype checking circuit 1.

Then, once this calibrating step has been carried out, the process according to the invention permits, directly on the production line, of checking systematically and in a very short time, all the printed circuits, and thus to detect all the pieces having a metallization fault, which is to say whose thickness of the metallization layer is less than the required.

It is important to note that the current of calibrated value applied to the series of vias passes through each via over all its height (h). Thus a defect of metallization of the internal wall of one via gives rise to a decrease of the voltage measured at the terminals of the series of vias. Because of this fact, any defect of metallization (non-conforming thickness) is rapidly detected.

It will also be noted that the boards embodying the printed circuits are homogeneous, which implies that a defect of metallization in a single one of the vias of the printed circuit board is an extremely rare case. Thus, when there is a defect of metallization, this defect is visible in each via of the printed circuit board. Thus by verifying in a checking circuit (located on a portion of the printed circuit (or on its technical strip)) that the metallization is correct, it is also verified that for all the other vias produced in this printed circuit, the metallization has the required thickness.

The invention claimed is:

1. A process for checking a quality of metallization of a printed circuit (2; 4a-4d), comprising:

providing a checking circuit (1) comprising n through openings (7-1 . . . 7-6, 8-1 . . . 11-6), called vias, with n a whole number greater than or equal to one, the vias being provided with an internal peripheral wall adapted to be clad with a metallized layer (12) during a metallization step of the printed circuit, the vias being connected electrically in series between two electrical terminals (16-18, 20-22), such that an electrical current applied between said electrical terminals passes in a direction of a height (h) along each of the vias (7-1 . . . 7-6, 8-1 . . . 11-6);

applying a current of predetermined intensity between the two electrical terminals (16-18, 20-22) of the checking circuit (1) by a computer processor;

measuring a corresponding voltage difference between the two electric terminals by said computer processor; and comparing the measured value with a threshold value representative of the voltage difference obtained for a metallized layer of minimum predetermined thickness deposited on the peripheral wall of each via (7-1 . . . 7-6, 8-1 . . . 11-6), so as to validate the printed circuit when the measured value is less than the threshold value by said computer processor.

2. The process according to claim 1, further comprising providing the checking circuit (1) comprising n vias (7-1 . . .

7-6, 8-1 ... 11-6), with n a whole number greater than or equal to two, connected two by two in series by electrical bridges (13, 14).

3. The process according to claim 2, wherein there is provided a checking circuit (1) of which the n vias (7-1 ... 7-6, 8-1 ... 11-6) each have a diameter equivalent to the smallest diameter of the functional vias of the printed circuit.

4. The process according to claim 2, wherein the checking circuit (1) is provided on a functional surface portion (2a) of the printed circuit (2).

5. The process according to claim 2, wherein the checking circuit (1) is provided on a technical strip (6) for mechanical connection of the printed circuits (4a-4d), during their production.

6. The process according to claim 1, wherein the checking circuit (1) of which the n vias (7-1 ... 7-6, 8-1 ... 11-6) each have a diameter equivalent to the smallest diameter of the functional vias of the printed circuit.

7. The process according to claim 6, wherein the checking circuit (1) is provided on a functional surface portion (2a) of the printed circuit (2).

8. The process according to claim 6, wherein the checking circuit (1) is provided on a technical strip (6) for mechanical connection of the printed circuits (4a-4d), during their production.

9. The process according to claim 1, wherein the checking circuit (1) is provided on a functional surface portion (2a) of the printed circuit (2).

10. The process according to claim 1, wherein the checking circuit (1) is provided on a technical strip (6) for mechanical connection of the printed circuits (4a-4d), during their production.

11. The process according to claim 1, wherein the two electrical terminals are provided on an upper surface of the printed circuit.

12. The process according to claim 1, wherein a first electric terminal of the two electrical terminals comprises two lugs (16, 18) interconnected by a conductive track (17), and one of said lugs (16) is connected by a conductive track (15) to the first via (7-1).

13. The process according to claim 1, wherein a second electric terminal of the two electrical terminals comprises two lugs (20, 22) interconnected by a conductive track (21), and one of said lugs (20) is connected by a conductive track (16) to the last via (11-6).

14. A process for checking a quality of metallization of a printed circuit (2; 4a-4d), comprising:

providing a checking circuit (1) comprising n through openings (7-1 ... 7-6, 8-1 ... 11-6), called vias, with n a whole number greater than or equal to one, the vias being provided with an internal peripheral wall adapted to be clad with a metallized layer (12) during a metallization step of the printed circuit, the vias being connected electrically in series between two electrical terminals (16-18, 20-22), such that an electrical current applied between said electrical terminals passes in a direction of a height (h) along each of the vias (7-1 ... 7-6, 8-1 ... 11-6);

applying a current of predetermined intensity between the two electrical terminals (16-18, 20-22) of the checking circuit (1) by a computer processor;

measuring a corresponding voltage difference between the two electric terminals by said computer processor; and comparing the measured value with a threshold value representative of the voltage difference obtained for a metallized layer of predetermined thickness deposited on the peripheral wall of each via (7-1 ... 7-6, 8-1 ... 11-6), so as to validate the printed circuit when the measured value is less than the threshold value by said computer processor.

15. The process according to claim 14, wherein the predetermined thickness is a minimum thickness.

16. The process according to claim 14, further comprising providing the checking circuit (1) comprising n vias (7-1 ... 7-6, 8-1 ... 11-6), with n a whole number greater than or equal to two, connected two by two in series by electrical bridges (13, 14).

17. The process according to claim 14, wherein the checking circuit (1) of which the n vias (7-1 ... 7-6, 8-1 ... 11-6) each have a diameter equivalent to the smallest diameter of the functional vias of the printed circuit.

18. The process according to claim 14, wherein the checking circuit (1) is provided on a functional surface portion (2a) of the printed circuit (2).

19. The process according to claim 14, wherein the checking circuit (1) is provided on a technical strip (6) for mechanical connection of the printed circuits (4a-4d), during their production.

20. The process according to claim 14, wherein the two electrical terminals are provided on an upper surface of the printed circuit.

* * * * *